United States Patent [19]
Schulte et al.

[11] 4,388,517
[45] Jun. 14, 1983

[54] SUBLIMATION PATTERNING PROCESS

[75] Inventors: Eric F. Schulte, Richardson; Vernon R. Porter, Plano, both of Tex.

[73] Assignee: Texas Instruments Incorporated, Dallas, Tex.

[21] Appl. No.: 189,495

[22] Filed: Sep. 22, 1980

[51] Int. Cl.³ .............................................. B23K 27/00
[52] U.S. Cl. ..................... 219/121 LJ; 219/121 LM
[58] Field of Search ...... 219/121 L, 121 LM, 121 LJ, 219/121 LN, 121 EB, 121 EM, 121 EK, 121 EJ

[56] References Cited
U.S. PATENT DOCUMENTS 4,272,775  6/1981  Compton et al. ........... 219/121 L X
4,289,381  9/1981  Garuin et al. ............. 219/121 LJ X

*Primary Examiner*—C. L. Albritton
*Attorney, Agent, or Firm*—Gary C. Honeycutt; Melvin Sharp; James T. Comfort

[57] ABSTRACT

A method for patterning layers of material on a substrate without photoresist by using a selective sublimation process. Differences in thermal conductivity of materials underneath a layer of material to be patterned cause patterning by sublimation over areas of low thermal conductivity, initiated by a pulsed or swept radiated energy source.

4 Claims, 3 Drawing Figures

SUBLIMATION PATTERNING PROCESS

BACKGROUND OF THE INVENTION

This invention relates to the formation of patterns of deposited material on a substrate; and more particularly to patterning material on a substrate by radiated energy.

The fabrication of integrated circuits involves the use of a substrate upon which layers of material are deposited in different patterns to construct active devices of different types and make interconnections among the devices. To accomplish this patterning of materials, photolithographic processing is used. Such processing involves the deposition of a layer of material to be patterned, photoresist material applied, positioning of a photomask over the layer, and exposure to light. The photoresist is developed and a rinse applied to remove the undesired photoresist. The remaining structure is subjected to a chemical etching solution which removes that part of the pattern layer not needed, or a plasma etch process may be used which etches and carries away as a vapor the removed substances.

SUMMARY OF THE INVENTION

The present invention makes use of differential thermal conductivity of substrate patterns. A semiconductor substrate, such as silicon, has a higher thermal conductivity than an insulator, such as silicon dioxide. The difference in the thermal conductivity of the two materials makes it possible to selectively remove the unwanted portion of an overlying layer without an etch process. A pulse of radiated energy is directed onto the layer of material to be patterned. Only the material over the areas of high thermal conductivity will remain, as the high thermal conductivity material will absorb some of the heat build-up in the material above it. The material over the areas of low thermal conductivity will absorb a greater fraction of the heat build-up, and be evaporated or sublimated.

This process may be repeated for subsequent layers of material deposited during the fabrication of devices, as long as there is a sufficiently large differential of thermal conductivity between two materials in the layer below the material to be patterned.

An object of the invention is to provide a more economical way to establish patterns as required for device fabrication, by eliminating some steps involving photoresist and associated chemical actions required for process using the current methods. Another object of the invention is to allow the use of metals in device fabrication that are difficult to work with using current methods, such as platinum.

DETAILED DESCRIPTION OF THE DRAWINGS

In the preferred embodiment of the present invention, a substrate of a material of high thermal conductivity 1 has deposited on it a pattern of insulating material 2. A layer of metal or other material of high thermal conductivity 3 is deposited over the entire surface.

Figure 1:
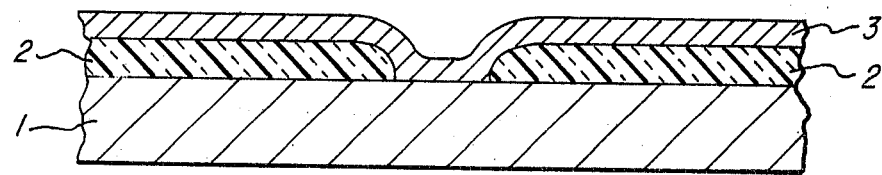
FIG. 1 is a cross-section view of a substrate and layers of insulator and deposited thin film of metal or other material.
Figure 2:
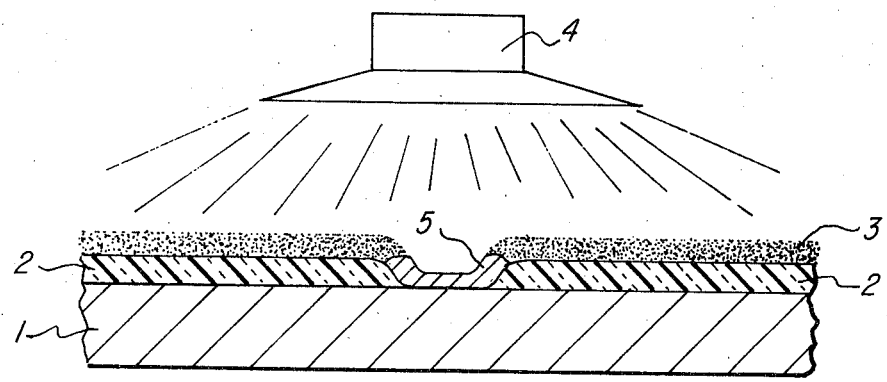
FIG. 2 is a cross-section view of the sublimation process taking place on the structure shown in FIG. 1.

FIG. 2 is a view showing a pulsed radiated energy source 4 being fired on the surface of the structure of FIG. 1 and the material above the low conductivity are as 3 beginning to sublimate. The metal above the high conductivity areas 5 remains.

Figure 3:
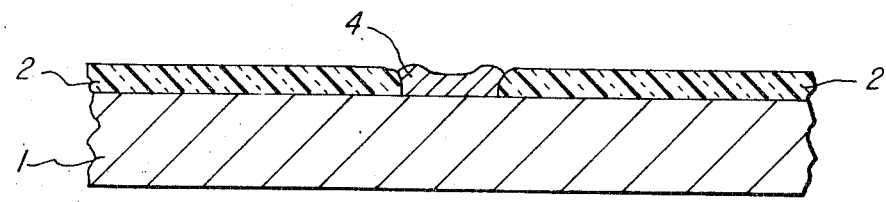
FIG. 3 is a cross-section view of the structure of FIG. 1 after the sublimation process.

FIG. 3 shows the result of the process where the metal 3 above the low thermal conductivity is sublimed, while the metal above the high thermal conductivity substrate 1 remains.

An example of operation of this process is to form a pattern of insulator, such as silicon dioxide, on a substrate of silicon or other material of high thermal conductivity. Over this is deposited a film of platinum iridium alloy or other material of high thermal conductivity, approximately 100 angstroms thick. A pulse or pulses of high intensity from a laser, xenon flash lamp, or electron beam, of approximately 50 nanoseconds, with sufficient energy to build up a power density of approximately 1 joule/square centimeter is directed onto the surface of the alloy. The sublimed material is moved away by connection, and the desired pattern remains.

As indicated, single crystal silicon has a high thermal conductivity, approximately 0.2 cal/cm$^2$/°K. Most semiconductor materials such as germanium, gallium arsenide, etc. have a thermal conductivity approximately the same. Materials having a low thermal conductivity, such as silicon oxide, measure approximately 0.004 cal/cm$^2$/°K. Other oxides, such as aluminum oxide, titanium oxide, etc. are in this group of materials. Patterning materials are usually metals of high thermal conductivity, such as palladium, aluminum and titanium tungsten, in addition to the mentioned example. Most metals will tend to have a high thermal conductivity with variations around an average, as will insulating materials have a low thermal conductivity around an average. The example mentioned here has a ratio of 50:1 for the high to low conductivity. While this ratio is not required for the process to work, the ratio between high thermal conductivity and low thermal conductivity must be of sufficient magnitude to avoid poor definition of patterning. A Minimum 2:1 ratio or higher is needed to obtain acceptable patterning. The thickness of patterning material, radiant energy level, and thickness of the low thermal conductivity insulating material may be adjusted to compensate for the differences in materials used, and their accompanying difference of thermal conductivity. The radiant energy level (power density) must be within the range 0.5 to 5 joules/cm$^2$. If the power density is too low for the materials used, poor patterning, or no metal removal, may occur. If the power density is too great, the heat build-up in the patterning metal, and the substrate, in areas where the substrate is directly beneath the metal, may cause removal of metal where it is not intended to be removed, and damage the substrate and/or the insulator material. The energy source which provides the power density may be operated as either a single pulse covering a large area, or a pulsed source, focused on a small area. In the pulsed mode of operation, the beam would be moved across the material surface so that the power density would be induced in overlapping spots. Any combination of the factors involved to accomplish this process are considered to be within the scope of this invention.

While the preferred embodiment of the present invention indicates a substrate of high thermal conductivity and areas of low thermal conductivity insulator material formed on the substrate, all covered by a metal film layer, the principle of the invention also applies to a substrate of low thermal conductivity, having areas of high thermal conductivity material formed on the substrate, and a metal film covering the entire surface, leaving metal only over the areas of high thermal conductivity after processing.

We claim:

1. A method for patterning a layer of material on a substrate, comprising the steps of:
   (a) selecting a substrate having high thermal conductivity;
   (b) depositing an insulating material having a low thermal conductivity over predetermined areas of the substrate;
   (c) depositing on said insulating material and on said substrate a thin film of a material capable of absorbing radiated energy easily; and
   (d) subjecting said thin film to radiant energy sufficient to cause selective sublimation of said thin film layer of material directly over said insulating material.

2. A method for patterning a layer of material over a substrate, comprising the steps of:
   (a) selecting a substrate having a low thermal conductivity;
   (b) forming on said substrate a pattern of material having a high thermal conductivity;
   (c) depositing a thin film layer of a material capable of absorbing radiant energy easily; and
   (d) subjecting said structure to sufficient amounts of radiant energy to cause selective sublimation of said thin film layer of material directly over said substrate.

3. A process which comprises the steps of:
   (a) depositing and patterning a first layer of material on a substrate to expose preselected portions of said substrate, said material having a sufficiently lower thermal conductivity than that of the substrate, such that when a second layer of material capable of absorbing sufficient radiated energy to be sublimated is deposited over said substrate and said first layer of material, and said second layer of material is exposed to radiated energy sufficient to cause sublimation of material, only that part of said second layer of material above the area having a low thermal conductivity will be sublimed;
   (b) depositing a thin film second layer, of a material capable of absorbing sufficient radiated energy to cause sublimation, over said substrate and first layer of material; and
   (c) exposing said second layer to a source of radiated energy sufficient to cause selective sublimation.

4. A method for the formation of a patterned thin film, comprising the steps of:
   depositing a thin film on a surface that includes areas of high thermal conductivity and areas of low thermal conductivity; and
   exposing said film to radiant energy controlled to cause selective vaporization of those portions of the film overlying said areas of low thermal conductivity.

* * * * *